United States Patent [19]
Dais et al.

[11] Patent Number: 5,530,202
[45] Date of Patent: Jun. 25, 1996

[54] METALLIC RF OR THERMAL SHIELD FOR AUTOMATIC VACUUM PLACEMENT

[75] Inventors: Jack L. Dais, Lakewood; Khalil N. Nikmanesh, Broomfield, both of Colo.

[73] Assignee: AT&T Corp., Murray Hill, N.J.

[21] Appl. No.: 370,040

[22] Filed: Jan. 9, 1995

[51] Int. Cl.⁶ .................................................. H05K 9/00
[52] U.S. Cl. .................. 174/35 R; 174/35 GC; 361/736; 361/816
[58] Field of Search ............... 174/35 R, 35 GC; 361/816, 736

[56] References Cited

U.S. PATENT DOCUMENTS

| | | | |
|---|---|---|---|
| 4,451,436 | 5/1984 | O'Hare | 422/186.29 |
| 4,626,963 | 12/1986 | Speer | 361/424 |
| 4,678,699 | 7/1987 | Kritchevsky et al. | 428/175 |
| 4,881,770 | 11/1989 | Marzinotto et al. | 294/64.1 |
| 5,089,794 | 2/1992 | Norimatsu | 331/68 |
| 5,166,772 | 11/1992 | Soldner et al. | 257/659 |
| 5,218,334 | 6/1993 | Bartlett | 338/61 |
| 5,235,131 | 8/1993 | Mueller et al. | 174/35 R |
| 5,422,433 | 6/1995 | Rivera et al. | 174/35 GC |

*Primary Examiner*—Kristine L. Kincaid
*Assistant Examiner*—Robert Decker
*Attorney, Agent, or Firm*—David Volejnicek

[57] ABSTRACT

A metallic RF or thermal shield (200, 200', 200") has a non-perforated area (202) around its center of mass, of a radius (203) sufficient for pick-up and placement of the shield by automatic vacuum pick-up equipment during automated surface-mount circuit assembly.

16 Claims, 3 Drawing Sheets

METALLIC RF OR THERMAL SHIELD FOR AUTOMATIC VACUUM PLACEMENT

TECHNICAL FIELD

This invention relates to radio-frequency (RF) and thermal shields.

BACKGROUND OF THE INVENTION

RF shields are used on printed-circuit (PC) boards to prevent electromagnetic interference (EMI) both by and of devices and links on the PC boards. State-of-the art circuit-assembly techniques use automation, whereby components are automatically placed by machine on PC boards and are then automatically soldered. Conventional drilled-through PC boards have component mounting holes extending through the board for mounting leads of the components. Automatic assembly techniques for these boards rely on robotics wherein finger-like devices pick up the components—including RF shields—and insert their leads into the appropriate holes.

Recently, surface-mount technology has been replacing drilled-through PC boards. In surface-mount technology, component mounting pads that are formed on the surface of the PC board replace mounting holes. During assembly, these pads are covered with solder paste, components are automatically placed on the pads by means of vacuum placement machines, and the assemblage is heated to melt the solder paste and thus attach the components to the PC board. The surface-mount technology is less expensive to practice. Inter alia, the elimination of robotic automatic-assembly machines and substitution therefor of vacuum-placement machines results in significant savings during circuit assembly.

Unfortunately, metallic RF shields have been considered to be too heavy for vacuum placement during surface-mount circuit assembly, as disclosed in U.S. Pat. No. 5,235,131. Consequently, it has been thought necessary to either place the metallic RF shields by hand or by robotic machines, or to replace metallic RF shields with other types of RF shields that are suited for vacuum placement as taught, for example, in U.S. Pat. No. 5,235,131. Hand placement of RF shields is expensive and also violates the concept of automated assembly. Robotic placement is expensive because it requires the addition of a robotic-placement machine to the conventional vacuum-placement machines in a surface-mount automated assembly line. And substitution of esoteric new types of RF shields for conventional metallic RF shields prevents use of these time-tested, effective, and inexpensive components in automated vacuum-placement surface-mount assembly.

Many circuit packs make use of a large mix of surface mount components with widely yawing thermal masses. During the reflow soldering operation, it is important to melt the solder at all joints and yet not damage any component due to excessive heating. To do this, it is sometimes necessary to place thermal shields over selected components to prevent thermal damage. Hand or robotic assembly of thermal shields is expensive and violates the concept of automated assembly.

SUMMARY OF THE INVENTION

We have recognized a fallacy in the prior art's assumption that metallic RF shields are too heavy for vacuum placement. Specifically, we have recognized that the difficulty experienced by the prior art in using vacuum placement for metallic RF shields is a consequence of the physical configuration of the prior-art metallic RF shields. A conventional metallic RF shield 100 is shown in FIG. 1. The surfaces of the conventional RF shield are covered by perforations 101 which make the shield relatively lighter than a non-perforated shield and also permit the entry of thermal energy into the shield to facilitate the reflow of solder paste inside the RF shield during circuit assembly. We have recognized that this physical configuration provides little or no non-perforated area for vacuum pickup of the shield. Accordingly, our invention is directed to solving the problems and disadvantages of the prior art by providing a non-perforated area on the RF or thermal shield surface surrounding the center of mass and centered substantially on the center of mass of a metallic or other-material shield, which non-perforated area is sized sufficiently for the weight of the shield to permit pick-up and placement of the shield by vacuum placement techniques. Preferably, the non-perforated area is substantially larger than other non-perforated areas of the surface that surrounds the center of mass, or even of all surfaces of the shield.

A shield configured according to the invention permits automatic vacuum pick-up and placement of the shield even if the shield is metallic. It therefore allows the use of time-tested, effective, and inexpensive RF and thermal shields in surface-mount assembly processes using the conventional vacuum pick-up and placement techniques. Yet it allows the shield to retain the perforations desirable for reducing the weight of the shield and for permitting entry of sufficient thermal energy into the shield to effect adequate solder paste reflow. At the same time, the shield provides sufficient thermal shielding of the components covered by the shield to prevent thermal damage thereto during the solder reflow operation. Also, if desired, the thermal shield can be removed after the soldering process is completed, and the thermal shield can be reused. Alternatively, the thermal shield can be soldered in place and become a permanent part of the circuit pack assembly, just like an RF shield.

These and other advantages and features of the invention will become apparent from the following description of an illustrative embodiment of the invention considered together with the drawing.

DETAILED DESCRIPTION

Figure 1:
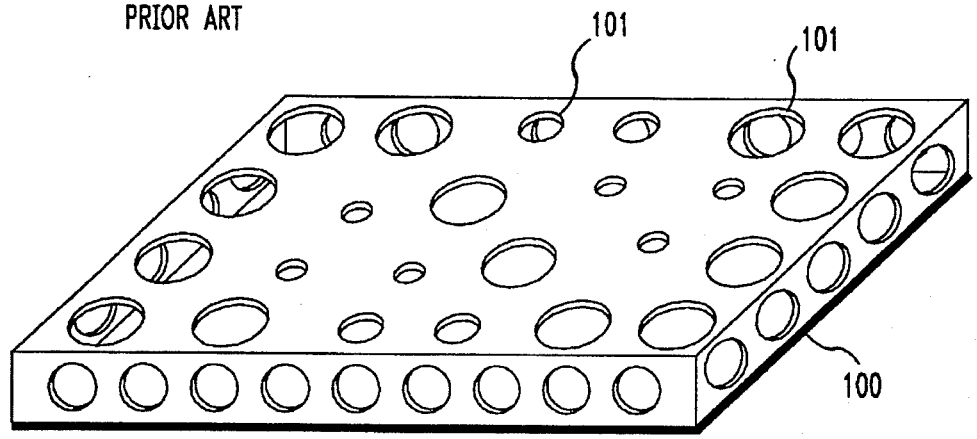
FIG. 1 is a perspective diagram of a prior-art metallic RF shield.
Figure 2:
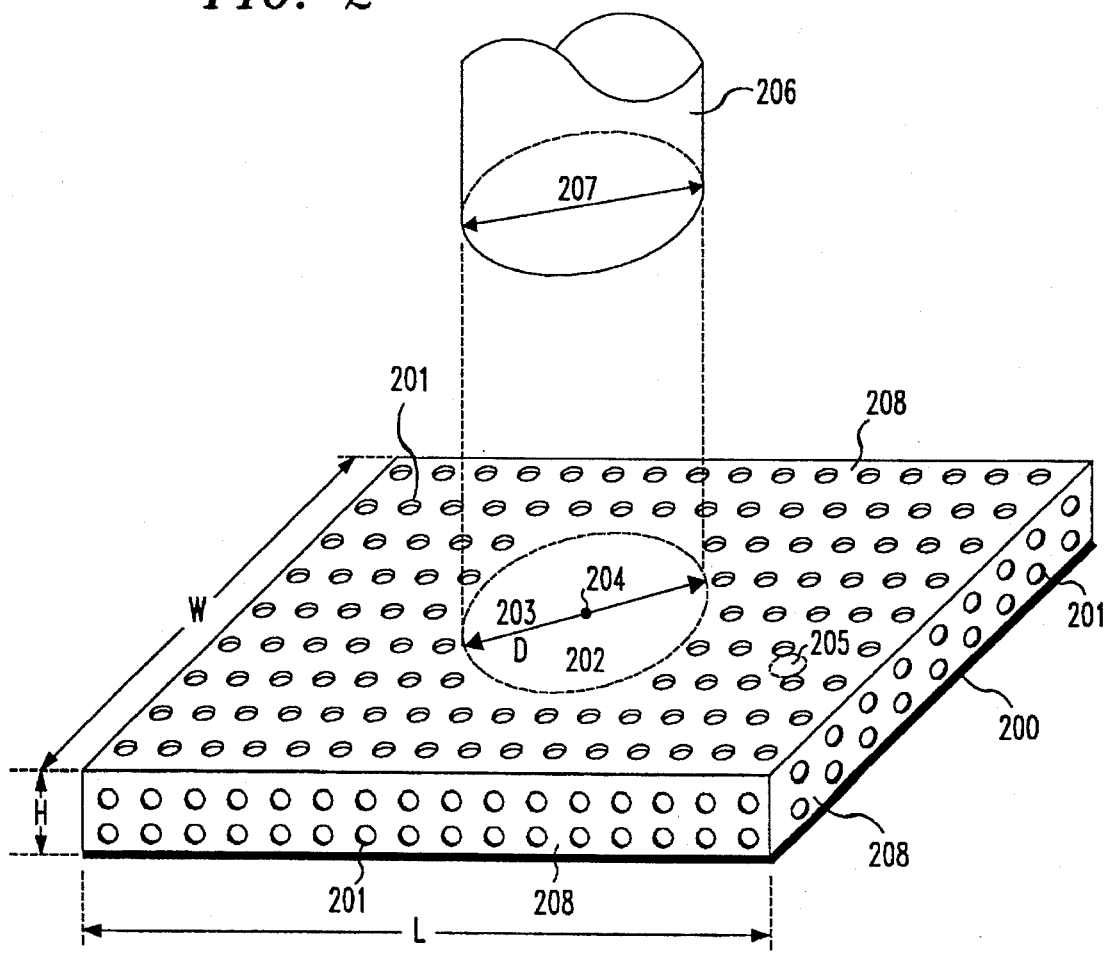
FIG. 2 is a perspective diagram of an RF or thermal shield that includes a first illustrative embodiment of the invention.

FIG. 2 shows an illustrative RF or thermal shield 200 that incorporates an embodiment of the invention. The surfaces 208 of shield 200 are covered by perforations 201 except in an area 202 that surrounds, and is centered on, the center of mass 204 of shield 200. As is well understood in the art, the size of perforations 201 is kept below one twentieth of the wavelength of radio-frequencies which RF shield 200 is intended to block. Non-perforated area 202 is much larger than other non-perforated areas 205 which lie among perforations 201. Area 202 is flat and smooth and has a diameter 203 of sufficient size for the weight of shield 200 to permit a vacuum pick-up head 206 capable of picking up that weight to fit within area 202. In other words, diameter 203 is greater than an internal diameter 207 of the corresponding vacuum pick-up head 206.

While the weight of shield 200 is the most critical determinant of requisite diameter 203, we have discovered that the physical dimensions of shield 200 likewise play a role in the sizing of diameter 203. Table A below expresses the relationships between weight and dimensions of RF shield 200 and diameter 203, which relationships were determined empirically. In Table A, dimensions (height H, width W, length L) of shield 200 and diameter (D) 203 of non-perforated area 202 are expressed in millimeters, and shield weight (M) is expressed in grams.

TABLE A

|        | MIN | MAX | D (mm.) |
|--------|-----|-----|---------|
| L (mm.) | 5   | 17  | 4.5     |
| W (mm.) | 5   | 17  |         |
| H (mm.) | 1   | 10  |         |
| M (g.)  | 0   | 1.5 |         |
| L (mm.) | 13  | 38  | 12      |
| W (mm.) | 13  | 38  |         |
| H (mm.) | 1   | 10  |         |
| M (g.)  | 0   | 10  |         |

Figure 3:
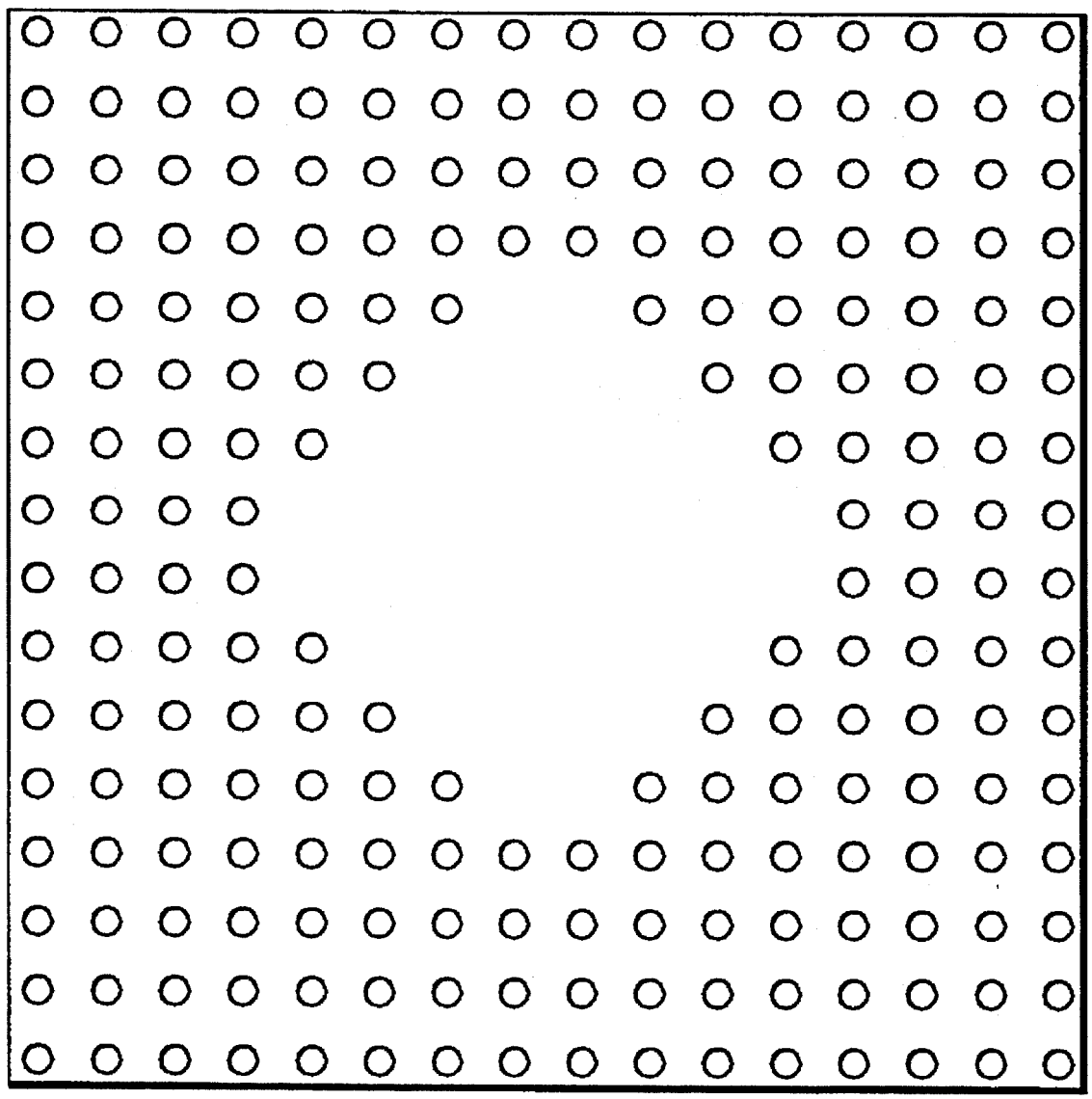
FIG. 3 is a top-view diagram of an RF or thermal shield that includes a second illustrative embodiment of the invention.

Area 202 need not be circular in shape. For example, it may be rectangular, and may further be oriented at 45 degrees (or any other angle) relative to the edges of RF shield 200 to provide an attractive and distinctive design, as shown in FIG. 3. Furthermore for purposes of attractive appearance and/or source identification, area 202 may carry a decal. The decal may be printed, stamped, or adhered thereon without affecting the smoothness of area 202 that is necessary for vacuum pickup.

Figure 4:
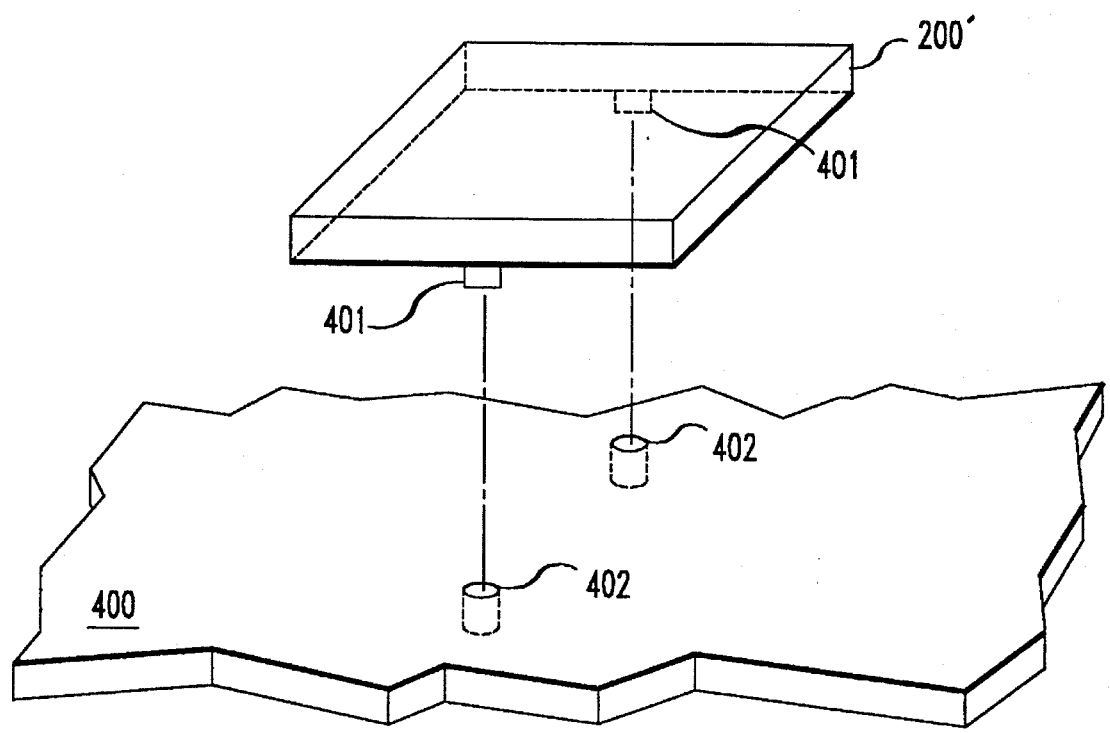
FIG. 4 is a perspective diagram of a thermal shield that includes a third illustrative embodiment of the invention.

FIG. 4 shows the shield configured as a removable thermal shield 200'. For purposes of ease of illustration, perforations 201 are not shown; alternatively, some or even all perforations 201 may be eliminated and shield 200' may have solid, non-perforated, surfaces. To prevent unwanted movement of shield 200' relative to a circuit board 400 during the soldering operation, shield 200' includes detents 401 which engage openings 402 in circuit board 400.

Figure 5:
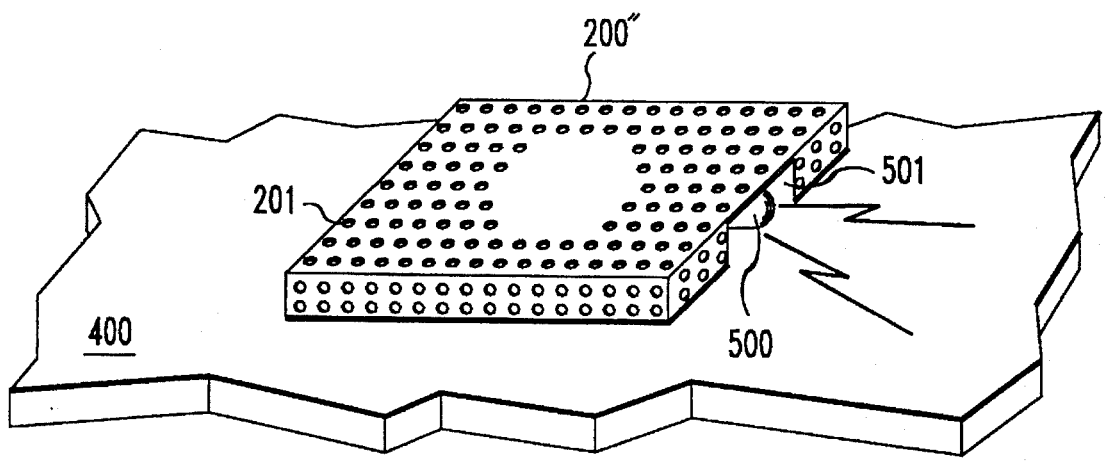
FIG. 5 is a perspective diagram of a thermal shield that includes a fourth illustrative embodiment of the invention.

FIG. 5 shows an alternative configuration of the thermal shield, designated as 200". Unlike thermal shield 200' of FIG. 4, thermal shield 200" of FIG. 5 is intended to be soldered to circuit board 400 and become a permanent part of the circuit pack. Thermal shield 200" retains perforations 201, which allow for visual inspection of the solder joints of components 500 that are covered by shield 200". To permit improved visual inspection of the solder joints, shield 200" further defines a large (relative to perforations 201) opening 501. In the case of a component 500 that is covered by shield 200" being, for example, a detector or an emitter component (e.g. an LED), opening 501 also serves the function of exposing the component 500 to functional interaction with entities of the outside world. Of course, shield 200" may define more than one opening 501, in any one or more of the surfaces of shield 200".

Of course, various changes and modifications to the illustrative embodiment described above will be apparent to those skilled in the art. For example, the shield need not be rectangular but may assume any desired shape, as may the non-perforated area. Nor need it be metallic. Such changes and modifications can be made without departing from the spirit and the scope of the invention and without diminishing its attendant advantages. It is therefore intended that such changes and modifications be covered by the following claims.

We claim:

1. A shield for attenuating at least one of RF and thermal energy, the shield being metallic and having a center of mass, a perforated surface surrounding the center of mass, and a non-perforated area defined by the surface, the non-perforated area centered substantially on the center of mass and sized to permit pick-up and placement of the shield by an automatic vacuum pick-up and placement machine.

2. The shield of claim 1 wherein the non-perforated area is the largest non-perforated area defined by the surface.

3. The shield of claim 1 having a plurality of non-coplanar surfaces wherein all surfaces of the shield are perforated.

4. The shield of claim 2 having a plurality of non-coplanar surfaces wherein all surfaces of the shield are perforated and the non-perforated area is the largest non-perforated area defined by all said surfaces.

5. The shield of claim 1 wherein the non-perforated area has one of circular shape and rectangular shape.

6. The shield of claim 1 wherein both the surface and the non-perforated area are rectangular in shape and the non-perforated area is oriented at a 45° angle relative to the surface.

7. The shield of claim 1 wherein the shield is an RF shield and each perforation is no larger than one-twentieth of a wavelength of RF which the RF shield is to block.

8. The shield of claim 1 wherein the shield is a re-usable thermal shield and the thermal shield defines at least one detent along a surface thereof that temporarily contacts a circuit board during assembly operations, for temporarily engaging a corresponding at least one opening in the circuit board during assembly operations and thereafter for disengaging the corresponding at least one opening.

9. The shield of claim 1 wherein a surface of the shield defines an opening through which a component shielded by the shield is able to interact with an entity external to the shield.

10. The shield of claim 1 wherein a surface of the shield defines an opening through which a solder joint of a component shielded by the shield is able to be inspected.

11. A surface-mount shield for attenuating at least one of RF and thermal energy, the shield being metallic and having a center of mass and a plurality of perforated surfaces including a first perforated surface surrounding the center of mass, the first perforated surface defining a non-perforated flat and smooth area centered substantially on the center of mass and sized to permit pick-up and placement of the shield by an automatic vacuum pick-up and placement machine, the non-perforated area being the largest non-perforated area defined by all said surfaces.

12. A shield for attenuating at least one of RF and thermal energy, the shield having a center of mass, a plurality of non-coplanar perforated surfaces one of which surfaces is located adjacent to the center of mass, and a non-perforated area defined by said one surface, the non-perforated area being centered substantially on the center of mass and being sized to permit pick-up and placement of the shield by an automatic vacuum pick-up and placement machine, said non-perforated area being the largest non-perforated area defined by all said surfaces.

13. The shield of claim 12 wherein the shield is metallic.

14. A surface-mount shield for attenuating at least one of RF and thermal energy, the shield having a center of mass and a plurality of non-coplanar perforated surfaces including a first perforated surface located adjacent to the center of mass, the first perforated surface defining a non-perforated flat and smooth area centered substantially on the center of mass and sized to permit pick-up and placement of the shield by an automatic vacuum pick-up and placement machine, the non-perforated area being the largest non-perforated area defined by all said surfaces.

15. The surface-mount shield of claim 14 wherein the shield is metallic.

16. The surface-mount shield of claim 15 wherein both the first surface and the non-perforated area are rectangular in shape and the non-perforated area is oriented at a 45° angle relative to the surface.

* * * * *